United States Patent

Urabe et al.

[11] Patent Number: 5,802,078
[45] Date of Patent: Sep. 1, 1998

[54] ERROR DETECTOR FOR ERROR DETECTING CODES

[75] Inventors: Kenzo Urabe, Sendai; Giho Makino, Tokyo; Syunji Tochihara, Tokyo; Yasuhiro Murayama, Tokyo; Atsushi Hoshi, Tokyo, all of Japan

[73] Assignee: Kokusai Electric Co., Ltd., Tokyo, Japan

[21] Appl. No.: 736,260

[22] Filed: Oct. 24, 1996

Related U.S. Application Data

[63] Continuation-in-part of Ser. No. 504,326, Jul. 19, 1995, abandoned, which is a continuation of Ser. No. 982,467, Nov. 27, 1992, abandoned.

[51] Int. Cl.$^6$ .................................................. G06F 11/00
[52] U.S. Cl. ............................................................ 371/37.8
[58] Field of Search .................................. 371/37.8, 37.5, 371/40.1, 38.1, 39.1, 37.1

[56] References Cited

U.S. PATENT DOCUMENTS

| | | | |
|---|---|---|---|
| 4,556,977 | 12/1985 | Olderdissen et al. | 371/37.1 |
| 5,384,786 | 1/1995 | Dudley et al. | 371/37.1 |
| 5,459,740 | 10/1995 | Glaise | 371/37.1 |
| 5,473,621 | 12/1995 | Wei | 371/43 |

*Primary Examiner*—Paul P. Gordon
*Attorney, Agent, or Firm*—Lackenbach Siegel Marzullo Aronson & Greenspan, P.C.

[57] ABSTRACT

There is disclosed an acceptable error detector for error correcting block codes, in which of received syndrome vectors S for the received word vectors Y available from the syndrome generator, the $m_e$-bit received subsyndromes $S(m_e)$ formed by the same components as those of the $m_e$-bit representative subsyndromes $<S(m_e)>$ uniquely corresponding to the vectors of all the acceptable error pattern with error bits equal to or less than the acceptable number e is applied as addresses into the redundant subsyndrome table memory. Since the stored data specified by the input address are $(m-m_e)$-bit redundant subsyndromes $<S(m-m_e)>$ which are supposed to appear in the remaining portion of $S(=<S>)$ when the number of error bits is equal to or less than e, the remaining $(m-m_e)$-bit received subsyndromes $S(m-m_e)$ derived from the received word vector Y in the syndrome generator and the $(m-m_e)$-bit redundant subsyndrome $<S(m-m_e)>$ obtained from the redundant subsyndrome table memory are compared with each other by a coincidence detector to detect coincidence or noncoincidence therebetween. By this configuration, it is possible to detect whether the number of error bits in received word is acceptable.

1 Claim, 2 Drawing Sheets

ERROR DETECTOR FOR ERROR DETECTING CODES

CROSS-REFERENCE TO RELATED APPLICATIONS

This is a continuation-in-part of application Ser. No. 08/504,326, filed on Jul. 19, 1955, and now abandoned, which is a continuation of application Ser. No. 07/982,467, filed on Nov. 27, 1992, and now abandoned.

BACKGROUND OF THE INVENTION

The present invention relates to an error detector for simplifying detection operations of code words in a system which uses error correcting block code words, sets a predetermined number of error bits less than the maximum number of correctable bits in the code words, and detects and rejects errors exceeding the predetermined number of error bits, thereby providing for enhanced reliability in the transmission and recording of data.

Conventional error detectors of this kind utilize a method wherein a list of syndromes during decoding, corresponding to all error patterns with error bits equal to or less than the predetermined number of error bits, is prestored as a table in a memory so that the table is searched for a match with the syndrome of each received code word, or a method wherein an error detection table, which uses patterns of all syndromes for received code words as addresses and stores, as data, one-bit acceptable error detection information indicating whether or not the number of error bits corresponding to the syndrome concerned is equal to or less than the predetermined number of error bits, is implemented in a memory so that the table is searched. With the former method, however, as the predetermined number of error bits increases, the table size of the list of syndromes increases and the number of steps (or time) for table search increases since the search involves sweeping of the table, thereby to offer difficulty in the speed-up of decoding. The latter method speeds up the error detection processing itself but has a detect that the size of the error detection table increases exponentially with an increase in the parity bit length of the code word.

SUMMARY OF THE INVENTION

An object of the present invention is to provide an error detector for error correcting block codes, which eases the above-mentioned problems of the prior art methods, that is, an increase in the number of steps (or time) involved in the error detection processing and an increase in the size of the table used for the error detection, and which has high-speed processing ability using a table of relatively small size and eases implementation into IC or soft-ware.

To attain the above object, the error detector for error correcting block codes according to the present invention is composed of:

a syndrome generator for receiving received words of n (a natural number) bits and computing and outputting an m-bit received syndrome for each of the received words depending on an algebraic structure of an error correcting block code, which has a code length n bits and a parity length of m (a natural number, n>m) bits;

a redundant subsyndrome table memory, for receiving as address data, a relevant $m_e$-bit representative subsyndrome ($m_e$: natural number, m>$m_e$), the $m_e$ bits being included in an m-bit syndrome for errors with a predetermined number of error bits equal to or less than e (a natural number) and being established for locating the positions of the predetermined number of error bits, and for prestoring as memory data, an (m−$m_e$)-bit redundant subsyndrome, which is a redundant remainder obtained from said m-bit syndrome by excluding said $m_e$-bit representative subsyndrome, used for the address data; and a coincidence detector for receiving the (m−$m_e$)-bit redundant subsyndrome from said redundant subsyndrome table memory by only one time accessing there to and an (m−$m_e$)-bit received subsyndrome obtained by selecting those bits corresponding to the (m−$m_e$)-bit redundant subsyndrome from the m-bit received syndrome supplied by said syndrome generator, for detecting whether or not the both inputs thereto coincide with each other by only one time comparing said both inputs, and for outputting the detected result in binary form.

BRIEF DESCRIPTION OF THE DRAWINGS

The present invention will be described in detail below with reference to the accompanying drawings, in which.

DETAILED DESCRIPTION OF PREFERRED EMBODIMENTS

Figure 1:
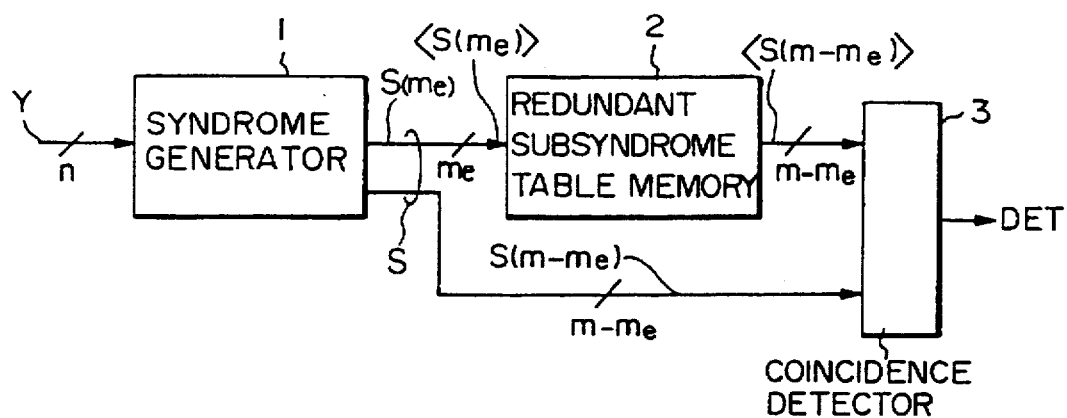
FIG. 1 is a block diagram of an error detector for error correcting block codes according to the present invention.

FIG. 1 illustrates in block form an example of an error detector for error correcting block codes according to the present invention. In FIG. 1, reference numeral 1 denotes a syndrome generator, which receives an n-bit received word Y, performs syndrome calculation (a well-known operation which utilizes, for example, a matrix operation using a parity check matrix, a power operation of a root vector of a generator polynomial, or a residue calculation of a polynomial using a shift register) dependent on an algebraic structure of an error correcting block code with n-bit code length and m-bit parity length (n>m>o), and outputs an m-bit received syndrome S corresponding to the n-bit received word Y.

Reference numeral 2 denotes a redundant subsyndrome table memory prestoring, as memory data, (m−$m_e$)-bit redundant subsyndrome <S(m−$m_e$)> obtained from an m-bit acceptable syndrome <S> at an address specified by $m_e$-bit representative subsyndrome <S($m_e$)>, wherein the m-bit syndrome <S> is an m-bit syndrome for errors with a predetermined number equal to or less than e of error bits. The m-bit syndrome <S> is uniquely represented by $m_e$-bit representative subsyndrome <S($m_e$)> included in the m-bit syndrome <S>, since <S($m_e$)> is so constructed that the set of $m_e$ bit is established for locating the error positions, and the (m−$m_e$)-bit redundant subsyndrome <S(m−$m_e$)> is a redundant remainder obtained from the m-bit syndrome <S> by excluding the $m_e$-bit representative subsyndrome <S($m_e$)>.

The redundant subsyndrome table memory 2 receives as address data <S($m_e$)>, $m_e$-bit received subsyndrome S($m_e$) which is included in the m-bit received syndrome S supplied by the syndrome generator 1, and is composed of the same $m_e$ bit members as those of the address data<$S(m_e)$>. Reference numeral 3 denotes a coincidence detector, which receives the (m−$m_e$) redundant syndrome <$S(m-m_e)$> supplied by the redundant subsyndrome table memory 2 and (m−$m_e$) bit received subsyndrome $S(m-m_e)$ obtained by selecting those bits corresponding to the (m−$m_e$)-bit redundant subsyndrome <$S(m-m_e)$> from the m-bit received syndrome S supplied by the syndrome generator 1, detects whether the both inputs coincide with each other or not, and provides a binary output as the coincidence detected output DET.

The operation of the error detector of the present invention, with reference to the example of FIG. 1, will hereinbelow be described in connection with its specific operation example.

Now, consider a case where a BHC code (15, 7) being an error correcting block code with n=15, m=8, the information bit length: k=n−m=7 and the theoretical maximum correctable number of error bits: t=2, is decoded with one-bit error correction (the number e of error bit=1) and two-bit error detection. A generator polynomial G(x) of this BHC code is a polynomial which includes the following two polynomials as factors, $$G\alpha(x) = x^4 + x + 1 \quad (1)$$

$$G\beta(x) = x^4 + x^3 + x^2 + x + 1 \quad (2)$$

and can be expanded as follows:

$$G(x) = G\alpha(x) \cdot G\beta(x) = x^8 + x^7 + x^6 + x^4 + 1 \quad (3)$$

At this time, a code polynomial (4) which comprises each bit $C_i$ (i=0 to 15) of an arbitrary code word:

$$C(x) = \sum_{i=0}^{15} C_i x^i, \quad (4)$$

includes G(x) as a factor.

In this case, let arbitrary roots of $G\alpha(x)$ and $G\beta(x)$ on a Galois extension field $GF(2^4)$ with a characteristic 2 and a degree 4 be represented by α and β, respectively. Since α and β are the roots of the above code polynomial C(x), we get the following:

$$C(\alpha) = C(\beta) = 0 \quad (5)$$

Hence, for the following matrix $$H = \begin{bmatrix} \alpha^{14} & \alpha^{13} & \ldots & \alpha^2 & \alpha^1 & \alpha^0 \\ \beta^{14} & \beta^{13} & \ldots & \beta^2 & \beta^1 & \beta^0 \end{bmatrix} \quad (6)$$

and a code word vector (n-dimensional)

$$C = (C_{14} \, C_{13} \ldots C_2 \, C_1 \, C_0)^T \quad (7)$$

(T indicates transpose)
The following equation holds:

$$H \cdot C = 0 \quad (8)$$

Therefore, H of Eq.(6) functions as a parity check matrix. By using the following four-dimentional unit vector notations fo r the power function values of α, $$\alpha^0 = \begin{bmatrix} 0 \\ 0 \\ 0 \\ 1 \end{bmatrix}, \alpha^1 = \begin{bmatrix} 0 \\ 0 \\ 1 \\ 0 \end{bmatrix}, \alpha^2 = \begin{bmatrix} 0 \\ 1 \\ 0 \\ 0 \end{bmatrix}, \alpha^3 = \begin{bmatrix} 1 \\ 0 \\ 0 \\ 0 \end{bmatrix}, \quad (9)$$

the parity check matrix by the notation of Eq.(6) is transformed to the following parity check matrix with m rows and n columns $$H = \begin{bmatrix} 1 & 1 & 1 & 1 & 0 & 1 & 0 & 1 & 1 & 0 & 0 & 1 & 0 & 0 & 0 \\ 0 & 1 & 1 & 1 & 1 & 0 & 1 & 0 & 1 & 1 & 0 & 0 & 1 & 0 & 0 \\ 0 & 0 & 1 & 1 & 1 & 1 & 0 & 1 & 0 & 1 & 1 & 0 & 0 & 1 & 0 \\ 1 & 1 & 1 & 0 & 1 & 0 & 1 & 1 & 0 & 0 & 1 & 0 & 0 & 0 & 1 \\ \hline 1 & 1 & 1 & 1 & 0 & 1 & 1 & 1 & 1 & 0 & 1 & 1 & 1 & 1 & 0 \\ 1 & 0 & 1 & 0 & 0 & 1 & 0 & 1 & 0 & 0 & 1 & 0 & 1 & 0 & 0 \\ 1 & 1 & 0 & 0 & 0 & 1 & 1 & 0 & 0 & 0 & 1 & 1 & 0 & 0 & 0 \\ 1 & 0 & 0 & 0 & 1 & 1 & 0 & 0 & 0 & 1 & 1 & 0 & 0 & 0 & 1 \end{bmatrix} \quad (10)$$

Apparently, the column vectors in the portions surrounded by the solid and dotted lines on the right-hand side of Eq.(10) correspond to the power function values of α and β on the right-hand side of Eq.(6) respectively, in the same column.

Next, by denoting the received word vector Y (n-dimentional) as $$Y = (Y_{14} \, Y_{13} \ldots Y_2 \, Y_1 \, Y_0)^T \quad (11)$$

and the syndrome vector (m-dimentional) for Y as, $$S = (S_7 \, S_6 \ldots S_2 \, S_1 \, S_0)^T \quad (12)$$

the syndrome vector S is calculated by the following equation:

$$S = H \cdot Y \quad (13)$$

therefore, according to the equation (8), when the received word vector Y is equal to the code word vector C, the syndrome vector S becomes zero.

When the received word vector Y contains an error denoted as an n-dimensional vector, $$E = (E_{14} \, E_{13} \ldots E_2 \, E_1 \, E_0)^T \quad (14)$$

the received word vector Y can be expressed as follows:

$$Y = C + E \quad (15)$$

(Where a notation + indicates an addition with modulus 2 or exclusive OR operation) Hence, from Eq.(8),(13) and (15), we get, $$S = H \cdot (C+E) = H \cdot C + H \cdot E = H \cdot E \quad (16)$$

Thus, the syndrome vector S uniquely corresponds to the vector E of the error pattern.

Now, according to the above code system, let us examine the feature of the m-bit acceptable error syndrome <S> for one-bit errors obtained by Eq.(16). In this instance, since any one of the bits $E_{14}$ to $E_0$ of the vector E in the error pattern in Eq.(14) is a state "1" (an error) and the others states "0's" (normal), the m-bit acceptable error syndrome <S> is found to be equal to one of the column vectors in the parity check matrix of Eq.(10) corresponding to the position of the error bit.

On the other hand, the factor $G\alpha(x)$ of the generator polynomial $G(X)$ is a primitive polynomial and its root $\alpha$ is a primitive element of $GF(2^4)$. That is, the minimum value of i (i.e. the order of $\alpha$) except for 0, which satisfies $\alpha^i=1$(unit element), is $2^4-1=15$ and therefore, none of $\alpha^0, \alpha^1 \ldots \alpha^{15}$ are equal to one another. This coincides with the fact that the 4-bit column vectors constituting the upper four columns in the parity check matrix of Eq.(10) (surrounded by the solid lines) are all unique.

Accordingly, when the number e of error bits is equal to 1, the $m_e$-bit representative subsyndromes $<S(m_e)>$ included in the syndrome $<S>$, composed of $m_e$ (=4) bits $S_7$, $S_6$, $S_5$ and $S_4$, correspond uniquely to respective 15 one-bit error patterns E ( i.e. respective one-bit error positions), and the $(m-m_e)$-bit redundant subsyndromes $<S(m-m_e)>$ composed of $m-m_e$ (=4) bits $S_3$, $S_2$, $S_1$ and $S_0$ and obtained after the extraction of the subsyndromes $<S(m_e)>$ from the m-bit acceptable syndrome $<S>$, are redundant remainder which are subordinately determined by the $m_e$-bit representative subsyndromes $<S(m_e)>$.

On the other hand, the m-bit received syndromes S for two-bit errors are the sum (an addition with modulus 2 of matrix elements or their exclusive OR operation) of two columns in the parity check matrix of Eq.(10) each corresponding to respective one-bit error positions, as is evident from Eq.(16).

Hence, it is no longer possible, to obtain unique correspondence between the $m_e$-bit received subsyndromes $S(m_e)$ and all two-bit errors, because the $m_e$-bit received subsyndromes $S(m_e)$ are mapped onto both one-bit errors and two-bit errors simultaneously. In other words, the $(m-m_e)$ bit received subsyndrome $S(m-m_e)$ is not redundant any more so that the detection of the error positions requires to introduce the total received syndromes S instead of $m_e$-bit received subsyndrome $S(m_e)$.

The properties of the parity check matrix and syndromes in the above specific example are also commonly found in the case of the other block codes with the maximum number of correctable error bits $t \geq 2$, and the error detector according to the present invention can perform an error detection by taking advantage of the above-mentioned properties.

For example, in case of t=3 and the acceptable number of error bits e=e, as is based upon a generator polynominal consisting of two factors as follows:

$$G(x)=G\alpha(x)\cdot G\beta(x)$$

the method to construct the $m_e$-bit representative subsyndrome is similar to that of previous example [Equation (6)], by using the following parity check matrix:

$$H=\begin{bmatrix} \alpha^{n-1} & \alpha^{n-2} & \ldots & \alpha^1 & \alpha^0 \\ \beta^{n-1} & \beta^{n-2} & \ldots & \beta^1 & \beta^0 \end{bmatrix}$$

In this example, a linear combination (sum) of arbitrary two column vectors in a solid line uniquely corresponds to any two bit error pattern. Therefore, it is obvious that the syndrome bits-calculated using the column vector $\alpha^i(0<i<n-1)$ constitute the $m_e$-bit representative subsyndrome, while the other syndrome bits using the column vector $\beta^i$ in a dotted line shown in Equation (2) constitute the $(m-m_e)$ bit redundant subsyndrome.

The summary of the configuration of the present invention is as follows:

Of the received syndrome vectors S for the received word vectors Y available from the syndrome generator 1 in FIG. 1, the $m_e$-bit received subsyndromes $S(m_e)$ formed by the same components as those of the $m_e$-bit representative subsyndrome $<S(m_e)>$ uniquely corresponding to the vectors of all the acceptable error pattern with error bits equal to or less than the number e is applied as addresses into the redundant subsyndrome table memory 2. Since the stored data specified by the input address are the $(m-m_e)$-bit redundant subsyndromes $<S(m-m_e)>$ which are supposed to appear in the remaining portion of $S(=<S>)$ when the number of error bits is equal to or less than e, the remaining $(m-m_e)$-bit received subsyndrome $S(m-m_e)$ derived from the received word vector Y in the syndrome generator 1 and the $(m-m_e)$-bit redundant subsyndrome $<S(m-m_e)>$ obtained from the redundant subsyndrome table memory 2 are compared with each other by the coincidence detector 3 to detect coincidence or noncoincidence therebetween. By this configuration, it is possible to detect whether the number of error bits the in received word is acceptable.

Next, a description will be given of specific operative example of the circuits, 1, 2 and 3 for use in the present invention.

For the syndrome generation, several methods are well-known, such as, for example, operations which uses a parity check matrix disclosed in a reference literature; R. E. Blahut, "THEORY AND PRACTICE OF ERROR CONTROL CODES", ADDISON-WESLEY PUBLISHING COMPANY, INC., 1984, P53, and the "method of substituting the root vector of a generator polynomial into a received word polynomial" disclosed on page 162 of the same literature. Furthermore, a circuit shown in FIG. 2 can be also used.

Figure 2:
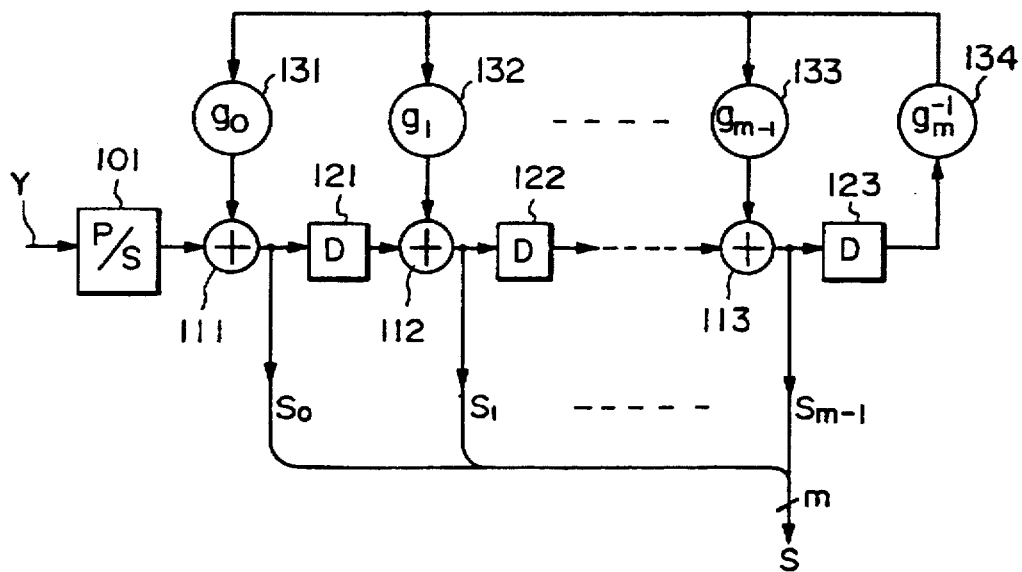
FIG. 2 is a block diagram illustrating an example of a syndrome generator for use in the present invention.

FIG. 2 shows in detail an example of the construction of the syndrome generator 1 in the case of generating syndromes from the results of a residue polynomial calculation by a generator polynomial defined in the code system. Reference numeral 101 denotes a parallel-to-serial code converter (P-S converter) into which the received word Y is input, and 111,112, . . . 113 adders with modulus 2 each of which adds two inputs to modulus p, a natural number, and when p=2, each adder is equivalent to an exclusive OR gate. Reference numerals 121,122, . . . 123 denote unit delay elements for delaying the outputs of the adders 111, 112, . . . , 113 by one bit, and 131,132, . . . 133 and 134 constant multipliers. The constant multiplier 134 multiplies the output of the unit delay element 123 by $g_{m-1}$, times and provides the multiplied output to all of the other constant multipliers 131,132, . . . , 133. The constant multipliers 131,132, . . . , 133 multiply the inputs by the constants $g_0$, $g_1, \ldots, g_{m-1}$, respectively, and feed back the multiplied outputs to the adders 111,112, . . . , 113 at respective one inputs thereof. In this case, $g_0$, $g_1, \ldots, g_{m-1}$, and $g_m$ are constants for coefficient of the generator polynomial:

$$G(X)=g_m x^m + g_{m-1} x^{m-1} + \ldots g_1 x + g_0 \quad (17)$$

The P-S converter 101 and the unit delay element 121 have their outputs connected to other inputs of the adders 111 and 112, respectively.

With such a construction as described above, the syndrome vector $(S_{m-1}, \ldots, S_1, S_0)^T$ appears at the outputs of the adders 111, 112, . . . , 113 constituting the coefficients of a residue polynomial;

$$R(x)=S_{m-1}x^{m-1}+ \ldots +S_1 x + S_0 \quad (18)$$

which is a residue when a received word polynomial corresponding to the received word vector is divided by a generator polynomial.

Figure 3:
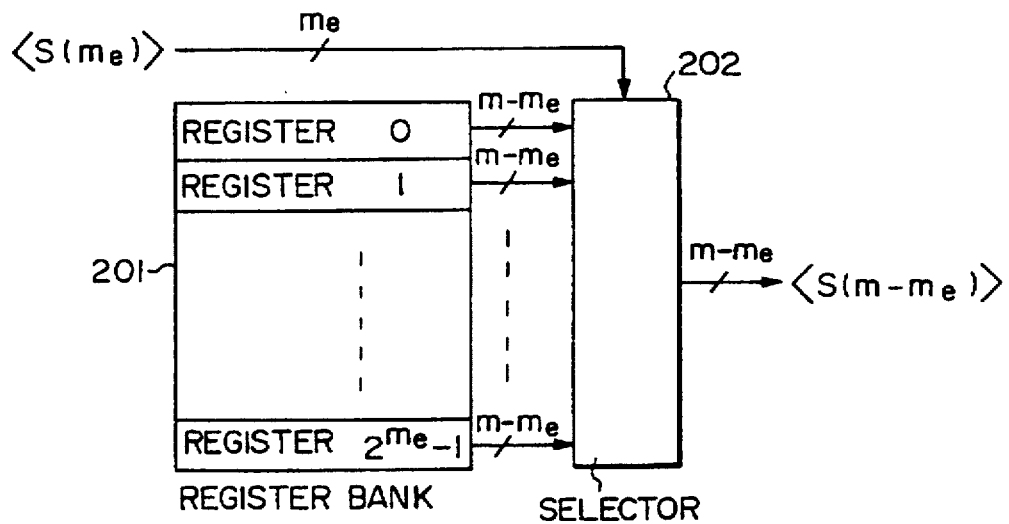
FIG. 3 is a block diagram illustrating an example of a redundant subsyndrome table memory for use in the present invention.

FIG. 3 shows a detailed example of the construction of the afore-mentioned redundant subsyndrome table memory. In FIG. 3, reference numeral 201 denotes a register bank composed of $2^{m_e}$ registers 0, 1, . . . , $2^{m_e}-1$ of (m−$m_e$)bit word length, and 202 a selector which selects and outputs one of the outputs of the $2^{m_e}$ register outputs in accordance with an $m_e$-bit address $<S(m_e)>$ which is provided from the syndrome generator 1. It is obvious that such a construction provides the implementation of the redundant subsyndrome table memory.

Figure 4:
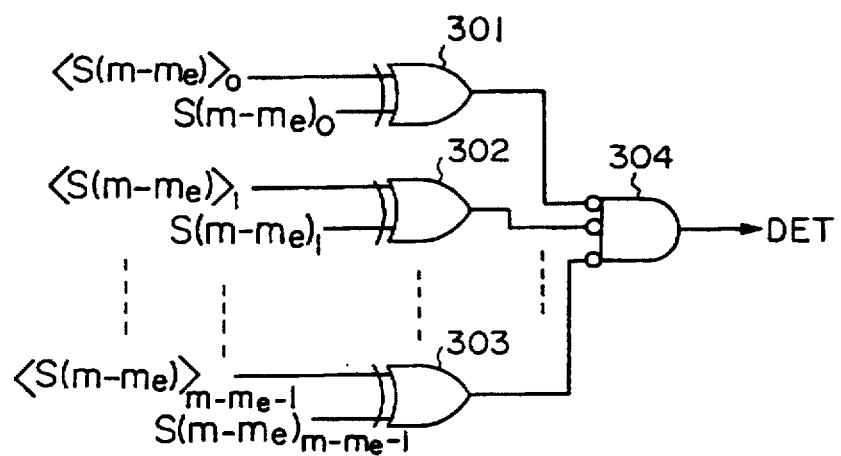
FIG. 4 is a block diagram illustrating a coincidence detector for use in the present invention.

FIG. 4 shows, in more detail, an example of the construction of the coincidence detector. In FIG. 4, reference numerals 301, 302, . . . , 303 denote exclusive-OR gates, which receive the corresponding counter parts of respective bits $<S(m-m_e)>_0$, $<S(m-m_e)>_1$, . . . $<S(m-m_e)>_{m-m_e-1}$, from $<S(m-m_e)>$ and $S(m-m_e)_0$, $S(m-m_e)_0$, $S(m-m_e)_1$, . . . $S(m-m)_{m-31\ m_e-1}$ from $S(m-m_e)$ to output a "0" or "1" depending on whether the both inputs coincide with each other or not. Reference numeral 304 denotes an NOR gate, whose output DET is in a state "1" only in a case where the outputs of the exclusive-OR gates 301, 302, . . . , 303 are all in a state "0," that is, only when $<S(m-m_e)>=S(m-m_e)$, and in other cases, the output DET is in a state "0."

It is clear that such a construction provides implementation of the function to detect the coincidence of $<S(m-m_e)>$ and $S(M-m_e)$.

Next, a brief description will be given of the scale of the table and processing speed required for the acceptable error detector according to the present invention. The storage capacity of the redundant subsyndrome table memory 2 for use in the present invention is (m−$m_e$) bits/word×$2^{m_e}$ words= $2^{m_e}$·(m−$m_e$) bits, as is evident from the foregoing description, and processing is completed with a single cycle of a readout operation of the memory and a coincidence check operation.

On the other hand, in the afore-mentioned conventional method in which a list of syndromes corresponding to all acceptable error patterns with the number of error bits equal to or less than the predetermined number of error bits is prestored as a table, the storage capacity required amounts up to $$\left( \sum_{j=0}^{e} {}_nC_j \right) \times m \text{ bits,}$$

and the maximum number of access operations to the table is:

$$\left( \sum_{j=0}^{e} {}_nC_j \right)$$

times, where ${}_nC_j$ is defined by:

$${}_nC_j = \frac{n!}{(n-j)! \cdot j!}$$

In another afore-mentioned method which employs a table using the syndromes S as addresses and one bit acceptable error detection information as data, the capacity is $2^m \times 1$ bits and the number of access operations to the table is one.

The capacity equations in the above-mentioned systems and the storage capacity values in the specific example described previously will be given in Table 1.

TABLE 1

|  | present invention | Prior Art Former | Prior Art Latter |
|---|---|---|---|
| Storage capacity expression | $2^{m_e}(m-m_e)$ bits | $\left( \sum_{j=0}^{e} {}_nC_j \right)$ bits | $2^m$ bits |
| Storage capacity in specific example n = 15, m = 8 t = 2, e = 1 | 64 bits ($m_e = 4$) | 128 bits | 256 bits |

From Table 1 it is seen that according to the error detector of the present invention, although the processing speed is not reduced, the storage capacity can be made remarkably smaller than those in the afore-mentioned two conventional methods. The effect of the reduction of the storage capacity increases with an increase in the value of each of n, m, and e. (Reference Literature: Peterson, W. W., and E. J. Weldon, Jr.,"E rror-Correcting Codes", 2nd Ed.,The M.I.T. Press, Cambridge, Mass., 1971)

As described above in detail, according to the present invention, the storage capacity of the table used can be substantially reduced without reducing the processing speed of acceptable error detection and hence the fabrication of the error detector as an IC is easy. Moreover, since almost all processing can be implemented in software, the invention further contributes to economization of the device.

What we claim is:

1. An error detector for error correcting block codes comprising:

a syndrome generator receptive of received words of n (a natural number) bits for computing and outputting an m-bit receiving syndrome depending on an algebraic structure of an error correcting block code which has a code length of n bits and a parity length of m (a natural number, n>m) bits;

a redundant subsyndrome table memory, for receiving as address data, a relevant $m_e$-bit representative subsyndrome ($m_e$: natural number, m>$m_e$), the $m_e$ bits being included in an m-bit acceptable syndrome for error with a predetermined number of error bits equal to or less than e (a natural number) and being established for locating the positions of the predetermined number of error bits, and for prestoring as memory data, an (m−$m_e$)-redundant subsyndrome, which is a redundant remainder obtained from said m-bit acceptable syndrome by excluding said $m_e$-bit representative subsyndrome, used for the address data; and a coincidence detector for receiving said prestored (m−$m_e$) bit redundant subsyndrome from said redundant subsyndrome table memory by only one time accessing thereto and an (m−$m_e$)-bit received subsyndrome obtained by selecting those bits corresponding to the (m−$m_e$)-bit redundant subsyndrome from the m-bit received syndrome supplied by said generator, for detecting whether or not both inputs thereto coincide with each other by only one time comparing mutually said both inputs, and for outputting the detected result in binary form.

* * * * *